United States Patent
Shekhawat et al.

[11] Patent Number: 6,140,152
[45] Date of Patent: Oct. 31, 2000

[54] POWER MODULE WITH LOWERED INDUCTANCE AND REDUCED VOLTAGE OVERSHOOTS

[75] Inventors: Sampat S. Shekhawat; John M. Coronati, both of Mountaintop, Pa.; John J. Tumpey, Oakhurst, N.J.

[73] Assignee: Intersil Corporation, Palm Bay, Fla.

[21] Appl. No.: 09/334,098

[22] Filed: Jun. 16, 1999

Related U.S. Application Data

[62] Division of application No. 09/167,203, Oct. 6, 1998, Pat. No. 6,069,403.

[51] Int. Cl.[7] ............................. H01L 21/44; H01L 21/48; H01L 21/50
[52] U.S. Cl. .............................................. 438/121; 438/106
[58] Field of Search ....................................... 438/121, 106, 438/133, 110; 257/691, 692, 693, 696, 724, 704

[56] References Cited

U.S. PATENT DOCUMENTS

| | | |
|---|---|---|
| 4,822,988 | 4/1989 | Gloton . |
| 4,996,583 | 2/1991 | Hatada . |
| 5,105,257 | 4/1992 | Michii . |
| 5,243,496 | 9/1993 | Mermet-Guyennet . |
| 5,424,579 | 6/1995 | Arai et al. .................. 257/692 |
| 5,459,641 | 10/1995 | Kuriyama . |
| 5,471,089 | 11/1995 | Nagatoma et al. . |
| 5,478,965 | 12/1995 | Hashiba . |
| 5,532,658 | 7/1996 | Tonegawa et al. . |
| 5,559,668 | 9/1996 | Kuriyama . |
| 5,576,927 | 11/1996 | Sekiguchi . |
| 5,600,178 | 2/1997 | Russell . |
| 5,763,946 | 6/1998 | Nakadaira et al. ............ 257/693 |

*Primary Examiner*—Olik Chaudhuri
*Assistant Examiner*—Phat X. Cao
*Attorney, Agent, or Firm*—Allen, Dyer, Doppelt, Milbrath & Gilchrist, P.A.

[57] ABSTRACT

A power module includes a semiconductor substrate and spaced power transistor circuits formed in the substrate, each having respective anode and cathode portions. A power module housing substantially encloses the substrate. Flexible cathode straps and flexible anode straps are connected to the respective anode and cathode portions and extend out of the power module housing spaced from each other. At least two anode straps and cathode straps fold over at least a portion of the power module housing to overlap each other and form phase straps. The remaining cathode and anode straps fold over at least a portion of the power module housing such that respective cathode and anode straps overlap each other, thereby lowering inductance and reducing voltage overshoots at turn off.

19 Claims, 2 Drawing Sheets

6,140,152

POWER MODULE WITH LOWERED INDUCTANCE AND REDUCED VOLTAGE OVERSHOOTS

This application is a division of Ser. No. 09/167,203 filed on Oct. 6, 1998. U.S. Pat No. 6,069,403, the disclosure of which is hereby incorporated by reference in its entirety.

FIELD OF THE INVENTION

This invention relates to the field of power modules, and more particularly, this invention relates to the field of power modules having silicon power transistor circuits.

BACKGROUND OF THE INVENTION

Transistor controlled power modules or "phase modules" are becoming increasingly important in the control of induction motors and other AC electrical devices. In a power circuit, it is necessary to create an AC output having an end use for running an induction motor. It is necessary to get the rotor to turn first. As a result, there must be an out-of-phase amperage and a power module forming a field used in a power motor.

One of the prior art problems in such circuits is maintaining a low inductance. When the powered circuit is operating in conjunction with a power module, the power switch allows a current to switch on and switch off very fast via the output of a power module. If there is a high inductance inside the module when the module switch is switched off, the amperage tries to fall very fast so that the slope of graph reflecting amperage versus time is very high. Because of this steep slope, there is a voltage overshoot, such as when trying to switch between the voltage and amperage. If the overshoot exceeds the overall breakdown voltage of the switch, then it is only possible to operate the switch at a fraction of the switch breakdown voltage. For example, if a field effect transistor (FET) used in switching applications can only handle 500 volts, and there is 150 volt overshoot, it is only possible to operate at the difference between those voltage levels, i.e., at only 350 volts.

Many of these power circuits use a power transistor circuit that is formed within a semiconductor substrate which, in turn, is enclosed within a power module housing, such as typically formed from an insulated material. These power transistor circuits could include field effect transistors or MOS controlled thyristors (MCT), and rectifiers. An example includes a circuit that forms a half-bridge circuit.

The power modules typically have positive and negative electrodes, which form anodes and cathodes that are connected to respective anode and cathode portions of silicon power transistor circuits formed in the substrate. These electrodes act as inductors and create voltage overshoot problems.

Snubber circuits (resistor, capacitor and diode) are also often used in conjunction with a power module and used for reducing the voltage overshoot by absorbing the energy. Typically, the snubber circuits are placed outside a power module. It is similar to adding an electrostatic discharge (ESD) circuit to absorb the energy. Snubber circuits control the voltage across the current through a controllable switch as the device is turning on or off. Typically, the snubber will limit the rate of rise in current as the device is turning on and limit the rate of rise in voltage as the device is turning off. However, snubber circuits can only limit the inductive overshoot by a limited amount. By adding a snubber package, the inductance stays the same. Only its effect is reduced because dv/dt at turn off is reduced.

It is desirable then to lower the inductance a greater amount in the power modules. However, there is only a limited amount of physical room in these power modules to implement mechanical and semiconductor design changes to reduce the inductance. By lowering the inductance in the power module, the voltage overshoot at turn off can be reduced which improves the safe operating area (SOA) curve. Another advantage in lowering the inductance in a power module is a reduction in the stray loss within the module due to current. Also, any reduction in inductance should preferably also reduce the direct cost of any materials and ease manufacturing.

SUMMARY OF THE INVENTION

It is therefore an object of the present invention to provide a power module that includes a power transistor circuit formed within a semiconductor that is enclosed within a power module housing, where the inductance is lowered without increasing undue complexity and cost to the power module.

In accordance with the present invention, it has been found that by running the positive and negative electrodes corresponding to the anode and cathode as close as possible, the flux enclosed by the electrodes is reduced and the inductance is reduced. It has also been found that the phase connections can be connected closer to the active devices, e.g., the switches, rather than having the phase formed further from the switches to reduce inductance. Thus, it is desirable to run any phase connections or electrodes as close to one another as possible to reduce the flux.

In accordance with the present invention, a power module includes a semiconductor substrate and spaced power transistor circuits formed in the substrate and each having respective anode and cathode portions. A power module housing substantially encloses the substrate. In a novel aspect of the present invention, flexible cathode straps are connected to the cathode portions and extend out of the power module housing spaced from each other. Flexible anode straps are connected to the anode portions and extend out of the power module housing spaced from each other.

At least two anode straps and cathode straps from respective spaced transistor circuits fold over at least a portion of the power module housing (typically the top cover) to overlap each other to form phase straps. The remaining cathode and anode straps fold over at least a portion of the power module housing such that respective anode and cathode straps overlap each other, thereby lowering inductance and reducing voltage overshoot and turn off. In this preferred aspect of the present invention, the remaining cathode straps overlap each other while the remaining anode straps overlap each other. In one aspect of the present invention, the phase straps are positioned medially along the power module housing in an area located between spaced transistor circuits.

In still another aspect of the present invention, two respective anode and cathode straps extend from opposite ends of the spaced power transistor circuits. Each of the spaced power transistor circuits further comprise a MOS controlled thyristor (MCT). Each of the spaced power transistor circuits also include a rectifier. The semiconductor substrate comprises a ceramic substrate, and in one aspect of the present invention, the ceramic substrate is formed from aluminum nitride. The power transistor circuits also include metallization as known to those skilled in the art, which can define the boundaries of the power silicon transistor circuits. A snubber circuit also aids in absorbing energy for voltage overshoots.

In still another aspect of the present invention, the substrate is substantially rectangular configured and enclosed within a substantially rectangular configured power module housing.

The present invention also comprises a method of forming a power module comprising the steps of forming a semiconductor substrate and forming spaced apart power transistor circuits in the substrate, each having respective anode and cathode portions. The method also comprises the steps of attaching flexible cathode straps to the cathode portions and attaching flexible anode straps to the anode portions. The substrate is enclosed within a power module housing and the anode and cathode straps are extended out of the power module housing at spaced points from each other.

The method includes the step of folding at least two anode straps and cathode straps over at least a portion of the power module housing to overlap each other to form phase straps and folding the remaining cathode and anode straps over at least a portion of the power module housing and in overlapping engagement to each other, thereby lowering inductance and reducing voltage overshoot and turn off. This is similar to reducing inductance by paralleling effect.

Current enters the terminals from two sides and then reduces the overall flux enclosed by the current. The method also comprises the step of extending two respective anode and cathode straps from opposite ends of the spaced power transistor circuits. The method comprises the step of forming the silicon power transistor circuits as MOS controlled thyristors (MCT). The method also comprises the step of forming a rectifier within each power transistor circuit. It is also desirable to form two power transistor circuits and form the substrate as a ceramic substrate. A ceramic substrate can be formed from aluminum nitride and is preferably substantially rectangular configured and enclosed within a rectangular configured power module housing.

The method also can comprise the step of forming metallization layers within transistor circuits. A snubber circuit can also be added to aid in absorbing energy for voltage overshoots.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
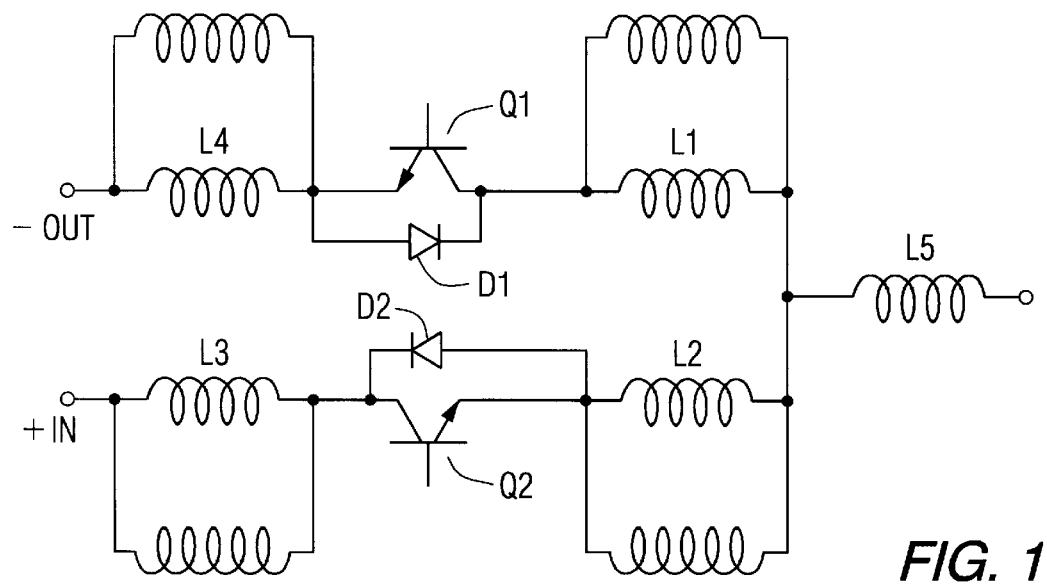
FIG. 1 is a schematic circuit diagram of a half-bridge module topology that reflects the present invention showing two power transistor circuits Q1, Q2 and electrodes that form inductances L1–L5, which are placed close to each other to lower inductance.

The present invention is advantageous because it now provides a low inductance power module (i.e., a phase module) used with a powered circuit to create an AC output such as for running induction motors. The lowered inductance reduces the voltage overshoot at turn off and improves the safe operating area curve. The power module of the present invention is a mechanical assembly with an improved mechanical circuit design, where the inductance yields an improved differential positive to negative inductance. The power module can typically include a half-bridge module topology, such as shown in FIG. 1, where two transistor circuits include preferably MOS controlled thyristors (MCT) (labeled as Q1 and Q2) with associated diodes or rectifiers (labeled as D1 and D2). The use of power modules is well known to those skilled in the art and examples include the power modules manufactured by Harris Corporation, such as PEBB.

Lowering the inductance in a power module reduces the voltage overshoot at turn off to improve the safe operating area curve. Also advantageous is the reduction of stray losses within the power module due to L di/dt effect. Because of the mechanical components and mechanical set up, the direct material cost reduction is improved and manufacturing ease is increased using standard manufacturing processes. By running the plus and minus electrodes as close as possible as shown in FIG. 1, the flux enclosed by these electrodes is reduced and, hence, the inductance is reduced.

As shown in FIG. 1, the half-bridge topology is illustrated where L1 and L4 correspond to plus and minus electrodes. L2 and L3 correspond to phase connections with the inductances reduced by connecting the phase connections closer to the devices, e.g., the transistor circuits or switches, rather than having a phase formed further from the switches (e.g., the transistor circuits). The same type of connections, such as for L1 and L4, are also used for L2 and L3, i.e., running the electrodes as close to one another as possible to reduce the flux. The L5 inductance as a phase would have no effect on the safe operating area curve during hard switching. Naturally, a snubber can be used to aid in reducing the inductive effect.

In order to reduce inductance further, any electrodes (anode and cathode) can be brought out from opposite ends of any power silicon chips formed on the semiconductor substrate and then folded over each other at the terminals.

Figure 2:
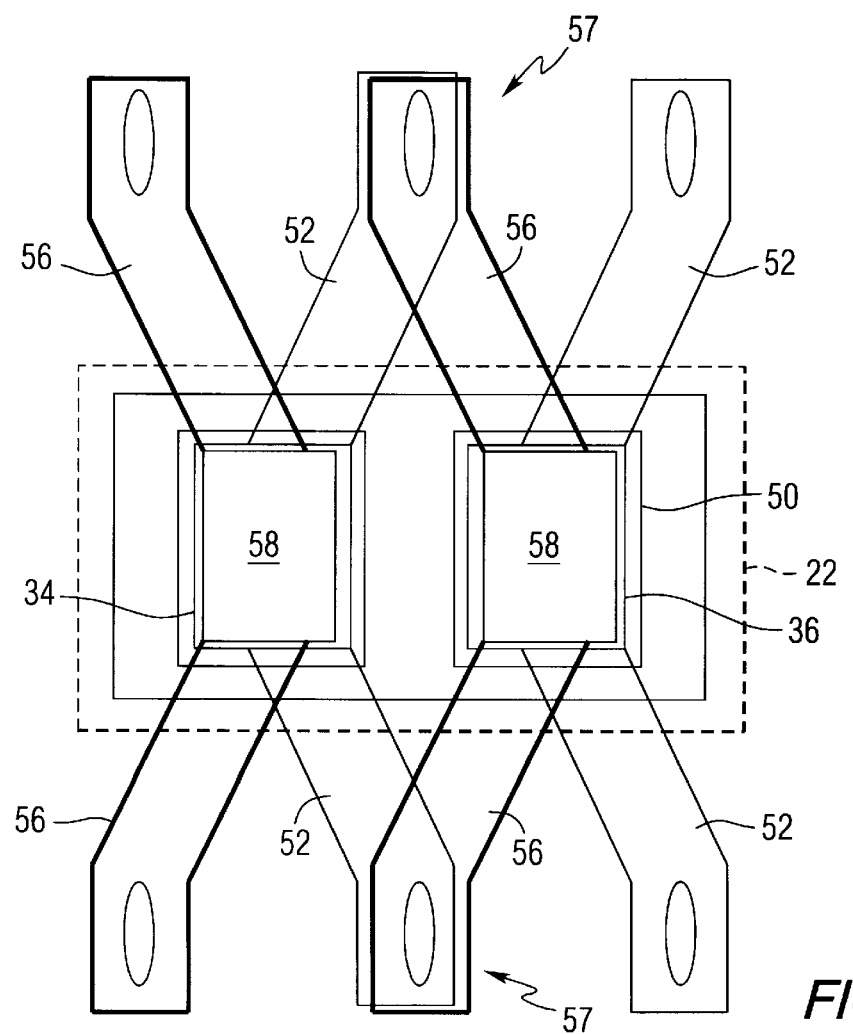
FIG. 2 is a schematic, top plan view of the power module of the present invention showing the anode, cathode and phase straps connected to the power transistor circuits.
Figure 3:
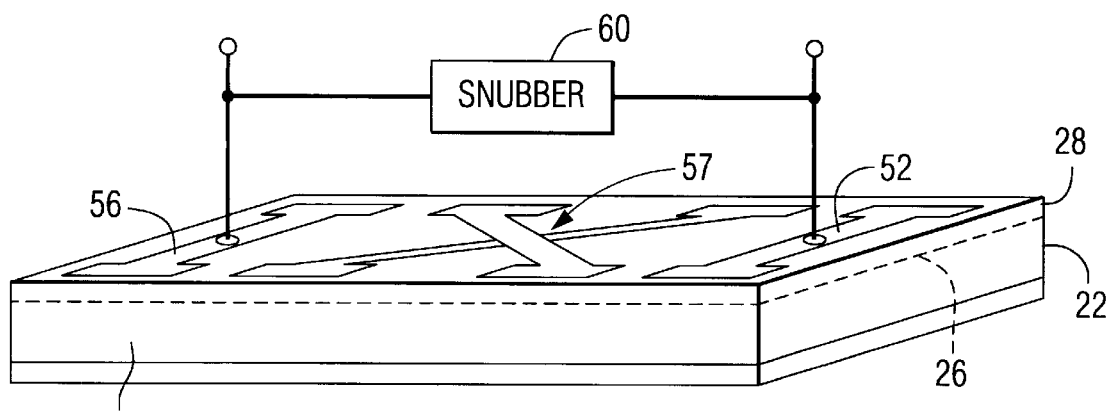
FIG. 3 is a schematic isometric view of a power module showing flexible anode, cathode and phase straps that extend out of the power module housing and fold over each other.

It is evident that inductance in a power module using a power silicon chip as known to those skilled in the art can be reduced as described above. FIG. 2 illustrates a top plan view of part of the power module of the present invention, and illustrated generally at 20. A power module housing 22 is shown by the dotted lines surrounding a semiconductor substrate, shown at 24. The semiconductor substrate includes internal semiconductor components forming the power switch, and manufactured by conventional semiconductor manufacturing techniques known to those skilled in the art. FIG. 3 shows an isometric view of a power module housing 22 that substantially encloses a substrate 24 (not shown). The dotted line indicated at 26 indicates a top lid or cover 28 of the power module housing 22 through which anode, cathode and phase straps can extend and fold over as will be explained below.

Figure 4:
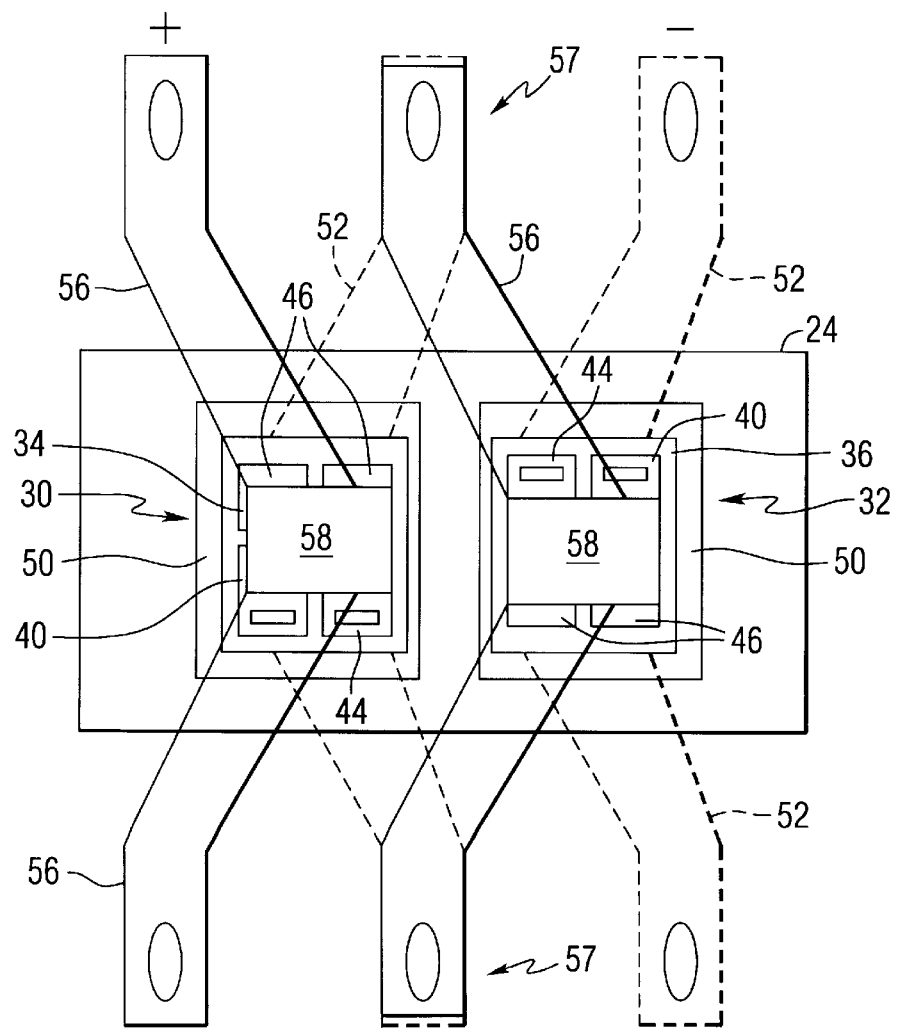
FIG. 4 is another schematic top plan view of the power module similar to the top plan view of FIG. 2, and showing greater details of the power transistor circuits with the attached anode, cathode and phase straps.

Referring now particulary to FIGS. 2 and 4, greater details of the power module 20 of the present invention are illustrated and described. The power module 20 includes a semiconductor substrate 24, which in one preferred embodiment, is a ceramic substrate such as formed from aluminum nitride. Naturally, other similar materials known to those skilled in the art can also be selected for this substrate. The substrate also is substantially rectangular configured and received within the power module housing that substantially encloses the substrate such as shown in the isometric drawing of FIG. 3. The power module housing can be formed from those standard materials known to those skilled in the art as used in the power module industry including phenolic resins and other similar materials.

FIG. 4 shows greater details of the various components. It is well known that power modules 20 include semiconductor power transistor circuits formed in the substrate 24 by well known semiconductor manufacturing techniques known to those skilled in the art, including deposition and doping techniques. The respective anode and cathode portions are formed by these techniques as well, as well known to those skilled in the art. The techniques for manufacturing power modules using silicon power transistor circuits is well known to those skilled in the art. The present invention is also advantageous because it now uses flexible cathode and anode straps and formed phase straps that are run as close as possible to reduce flux and reduce the inductance.

As shown in FIG. 4, two spaced power transistor circuits 30,32 are formed in the substrate 24. Each transistor circuit 30,32 includes respective anode and cathode portions 34,36 as shown in the portion of FIG. 4 that is broken away. FIG. 2 shows a complete top plan view where the anode portion 34 is not broken away.

As shown in FIG. 4, the two spaced power transistor circuits 30,32 are shown as formed in the semiconductor substrate 24. Each power transistor circuit includes a MOS controlled thyristor (MCT) 40 (referring to Q1 and Q2 of FIG. 1). The MCT transistors 40 are formed by conventional techniques well known to those skilled in the art. Another transistor 44 is formed in each transistor circuit is not an MCT transistor. It is not shown in detail in FIG. 1, but its function is operable as part of the overall circuit and the particular type and grade is chosen by those skilled in the art. Each power transistor circuit 30,32 includes at least one rectifier and in the illustrated embodiment of FIG. 4, two rectifiers illustrated at 46. These rectifiers 46 work in conjunction with the MCT transistor 40 and other transistor 42 and function within the power module by an operation well known to those skilled in the art.

Each of the power transistor circuits 30,32 also includes a metallization layer 50, which defines an outer section of each power transistor circuit. The metallization layers 50 are substantially rectangular configured such that the overall spaced silicon power transistor circuits are each rectangular configured. The cathode portion 36 is formed within the metallization layer as illustrated. These components are formed by techniques known to those skilled in the art, including any doping and other semiconductor and electronic component manufacturing techniques.

In accordance with the present invention, flexible cathode straps 52 are connected to the cathode portions 36 and extend out of the power module housing 22 through strap slots 54 at spaced points from each other. Flexible anode straps 56 are connected to the anode portions 34 and extend out of the power module housing through strap slots 54 at spaced points from each other. As shown in FIG. 2, the anode portions 34 include the surface contact pads 58, which extend across the transistor circuits as illustrated. The cathode straps 52 could be connected to contact pads, which could extend across the cathode portions 36 formed in the substrate adjacent the metallization layer. The anode straps 56 are shown with the dark lines in FIG. 2, and the cathode straps 52 are shown by the lighter lines. In FIG. 4, the anode straps 56 are shown by the solid lines and the cathode straps 52 are shown by the dotted line configuration.

It is evident that four cathode straps 52 and four anode straps 56 are connected in the particular illustrated example. Two anode straps and two cathode straps are connected to each power transistor circuit 30,32. At least two anode straps 56 and two cathode straps 52 fold over at least a portion of the power module housing (FIG. 3) to overlap each other in a location, in this illustrated example, located medially between the spaced transistor circuits on top the power module housing to form the phase straps for a phase connection indicated generally at 57. The remaining two cathode straps 52 and anode straps 56 fold over at least a portion of the power module housing 22 as shown in FIG. 3, and overlap each other, thus lowering inductance and reducing voltage overshoot at turn off. The remaining two anode and cathode straps fold over each other and extend from opposite ends of the spaced silicon power transistor circuits, as shown in FIG. 4.

The flexible straps 52,56 can be formed by any flexible current bearing material known to those skilled in the art as long as it allows appropriate flexibility to allow the strap to bend around the power module housing. Naturally, the configuration of the power module can vary depending on the number of spaced power transistor circuits as long as the anode and cathode terminals are placed close to each other to lower the inductance. It is also possible to use a snubber circuit 60 that can be placed outside the power module housing 22, as shown in the schematic of FIG. 3.

The power module 20 of the present invention will have a lowered inductance and reduced voltage overshoot at turn off to improve the safe operating area curve. Each "electrode" or strap is folded back from the two sides. For example, electrode or strap 56 is folded back to form a terminal that reduces the inductance further by reducing the flux or paralleling effect. Also, the stray loss within the module due to current is reduced. Two motivating and governing factors are the cost reduction necessary for direct materials and the ease of manufacturing using standard processes. It is possible that the inductance of this mechanical assembly of the power module as described could yield a differential plus to minus inductance of about 5 nano-Henry.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method of forming a power module comprising the steps of:

forming a semiconductor substrate;

forming spaced apart power transistor circuits in the substrate, each having respective anode and cathode portions;

attaching flexible cathode straps to the cathode portions;

attaching flexible anode straps to the anode portions;

enclosing the substrate within a power module housing and extending the anode and cathode straps out of the power module housing spaced from each other;

folding at least two anode straps and cathode straps over at least a portion of the power module housing to overlap respective straps to form phase straps; and folding the remaining cathode and anode straps over at least a portion of the power module housing such that respective anode and cathode straps overlap each other and in overlapping engagement to each other thereby lowering inductance and reducing voltage overshoot at turn off.

2. A method according to claim 1, and further comprising the step of extending two respective anode and cathode straps from opposite ends of the spaced power transistor circuits.

3. A method according to claim 1, and further comprising the step of forming the power transistor circuits as MOS controlled thyristor (MCT).

4. A method according to claim 2, and further comprising the step of forming at least one rectifier within each power transistor circuit.

5. A method according to claim 1, and further comprising the step of forming two power transistor circuits.

6. A method according to claim 1, and further comprising the step of forming the substrate as a ceramic substrate.

7. A method according to claim 6, and further comprising the step of forming the ceramic substrate from aluminum nitride.

8. A method according to claim 1, and further comprising the step of forming a substantially rectangular configured substrate.

9. A method according to claim 1, and further comprising the step of forming metallization layers within the transistor circuits.

10. A method according to claim 1, and further comprising the step of adding a snubber circuit to aid in absorbing energy for voltage overshoots.

11. A method according to claim 5, and further comprising the step of forming a substantially rectangular configured substrate.

12. A method of forming a power module comprising the steps of:

forming a semiconductor substrate;

forming spaced apart power transistor circuits in the substrate, each having respective anode and cathode portions;

attaching at least two flexible cathode straps to the cathode portions;

attaching at least two flexible anode straps to the anode portions;

enclosing the substrate within a power module housing having a top cover and extending two respective anode and cathode straps from opposite ends of the spaced apart power transistor circuits and out of the top cover of the power module housing such that the anode and cathode strips are spaced from each other;

folding at least two anode straps and cathode straps over at least a portion of the top cover of the power module housing to overlap respective straps to form phase straps; and folding the remaining cathode and anode straps over at least a portion of the top cover of the power module housing such that respective anode and cathode straps overlap each other on the top cover and in overlapping engagement to each other thereby lowering inductance and reducing voltage overshoot at turn off.

13. A method according to claim 12, and further comprising the step of forming the power transistor circuits as MOS controlled thyristor (MCT).

14. A method according to claim 12, and further comprising the step of forming at least one rectifier within each power transistor circuit.

15. A method according to claim 12, and further comprising the step of forming two power transistor circuits.

16. A method according to claim 12, and further comprising the step of forming the substrate as a ceramic substrate.

17. A method according to claim 16, and further comprising the step of forming the ceramic substrate from aluminum nitride.

18. A method according to claim 12, and further comprising the step of forming metallization layers within the transistor circuits.

19. A method according to claim 12, and further comprising the step of adding a snubber circuit to aid in absorbing energy for voltage overshoots.

* * * * *